(12) United States Patent
Hou et al.

(10) Patent No.: US 10,593,708 B2
(45) Date of Patent: Mar. 17, 2020

(54) ARRAY SUBSTRATE AND DRIVING METHOD THEREOF, DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Tao Hou, Beijing (CN); Junping Bao, Beijing (CN); Xinghua Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/951,767

(22) Filed: Apr. 12, 2018

(65) Prior Publication Data

US 2019/0067329 A1    Feb. 28, 2019

(30) Foreign Application Priority Data

Aug. 31, 2017    (CN) .......................... 2017 1 0772814

(51) Int. Cl.
*G09G 3/36*      (2006.01)
*H01L 27/12*     (2006.01)
*G02F 1/1362*    (2006.01)

(52) U.S. Cl.
CPC ...... *H01L 27/124* (2013.01); *G02F 1/136213* (2013.01); *G02F 1/136286* (2013.01);
(Continued)

(58) Field of Classification Search
CPC ............... H01L 27/124; H01L 27/1255; H01L 27/3276; H01L 27/3265; G02F 1/136286;
(Continued)

(56) References Cited

U.S. PATENT DOCUMENTS

2003/0059986 A1*   3/2003   Shibata ............. G02F 1/136209
                                                              438/149
2005/0243044 A1*  11/2005   Kang ................ G02F 1/136286
                                                              345/87
(Continued)

FOREIGN PATENT DOCUMENTS

CN           1945840 A        4/2007
CN         101030588 A        9/2007
(Continued)

OTHER PUBLICATIONS

The First Chinese Office Action dated Sep. 29, 2019; Appln. No. 201710772814.0.

*Primary Examiner* — Jose R Soto Lopez
(74) *Attorney, Agent, or Firm* — Ladas & Parry, LLP

(57) ABSTRACT

An array substrate, a driving method thereof and a display device are provided. The array substrate includes a base substrate, a pixel electrode located on the base substrate; a first gate line and a second gate line located on the base substrate at both sides of the pixel electrode, respectively, the pixel electrode being partially overlapped with the first gate line and the second gate line respectively to form a first storage capacitor and a second storage capacitor respectively; and a gate driver connected with the first gate line and the second gate line and configured to sequentially provide a gate signal to the first gate line and the second gate line and perform a waveform chamfering operation to the gate signal.

17 Claims, 3 Drawing Sheets

(52) U.S. Cl.
CPC ....... *G09G 3/3685* (2013.01); *H01L 27/1255* (2013.01); *G02F 2201/123* (2013.01); *G09G 2310/0264* (2013.01)

(58) Field of Classification Search
CPC ......... G02F 1/136213; G02F 2201/123; G02F 1/134; G09G 3/3685; G09G 2310/0264; G09G 2320/0219; G09G 2300/08; G09G 3/20; G09G 2230/00; G09G 3/3674; G09G 3/3266
See application file for complete search history.

(56) References Cited

U.S. PATENT DOCUMENTS

| | | | | |
|---|---|---|---|---|
| 2006/0022201 A1* | 2/2006 | Kim | ................ | G02F 1/1339 257/72 |
| 2007/0166859 A1* | 7/2007 | Lee | ................ | G02F 1/136213 438/30 |
| 2008/0002125 A1* | 1/2008 | Kim | ................ | G02F 1/136209 349/140 |
| 2008/0017886 A1* | 1/2008 | Chang | ................ | G02F 1/136213 257/203 |
| 2008/0042134 A1* | 2/2008 | Jung | ................ | G02F 1/1368 257/59 |
| 2008/0158455 A1* | 7/2008 | Yoo | ................ | G02F 1/136213 349/38 |
| 2008/0291152 A1* | 11/2008 | Nakao | ................ | G09G 3/003 345/102 |
| 2008/0303765 A1* | 12/2008 | Nakatsuka | ................ | G09G 3/3648 345/87 |
| 2009/0115750 A1* | 5/2009 | Chen | ................ | G06F 3/0412 345/204 |
| 2009/0189883 A1* | 7/2009 | Chung | ................ | G09G 3/3674 345/213 |
| 2009/0289884 A1* | 11/2009 | Yanagi | ................ | G09G 3/3677 345/92 |
| 2009/0295779 A1* | 12/2009 | Yanagi | ................ | G09G 3/3677 345/213 |
| 2010/0097546 A1* | 4/2010 | Chang | ................ | G02F 1/136209 349/111 |
| 2010/0289785 A1* | 11/2010 | Sawabe | ................ | G09G 3/3677 345/208 |
| 2011/0084894 A1* | 4/2011 | Siao | ................ | G09G 3/20 345/55 |
| 2011/0205195 A1* | 8/2011 | Komatsu | ................ | G09G 3/344 345/204 |
| 2011/0221731 A1* | 9/2011 | Tae | ................ | G02F 1/136213 345/211 |
| 2013/0234626 A1* | 9/2013 | Li | ................ | H05B 37/02 315/360 |
| 2014/0240632 A1* | 8/2014 | Kim | ................ | H01L 27/1288 349/43 |
| 2016/0133216 A1* | 5/2016 | Song | ................ | G09G 3/3696 345/205 |
| 2016/0365060 A1* | 12/2016 | Yabuki | ................ | G09G 3/3696 |
| 2017/0010502 A1* | 1/2017 | Park | ................ | G02F 1/136209 |
| 2017/0146853 A1* | 5/2017 | Lee | ................ | G02F 1/13439 |
| 2017/0285428 A1* | 10/2017 | Seong | ................ | G02F 1/136286 |
| 2018/0151136 A1* | 5/2018 | Oh | ................ | G09G 3/3614 |
| 2018/0182341 A1* | 6/2018 | Imajo | ................ | G09G 3/20 |
| 2018/0301472 A1* | 10/2018 | Matsukizono | ................ | G02F 1/1368 |

FOREIGN PATENT DOCUMENTS

| | | |
|---|---|---|
| CN | 102568406 A | 7/2012 |
| WO | 2007/052408 A1 | 5/2007 |

\* cited by examiner

ARRAY SUBSTRATE AND DRIVING METHOD THEREOF, DISPLAY DEVICE

TECHNICAL FIELD

At least one embodiment of the present disclosure relates to an array substrate, a driving method thereof, and a display device.

BACKGROUND

An array substrate generally includes a structure of storage capacitor (Cs) on gate. The structural characteristic of the Cs on gate is that a storage capacitor is formed by covering a scanning line of pixels in a previous row with a pixel electrode, or a storage capacitor is formed by covering a pixel electrode in the previous row with a scanning line. The storage capacitor is used to ensure a stability of a pixel voltage.

SUMMARY

At least one embodiment of the present disclosure provides an array substrate, a driving method thereof, and a display device. The pixel electrode in the array substrate and the gate lines on both sides thereof respectively form storage capacitors so that a sustaining voltage of the pixel electrode is almost equal to a charging voltage, and a charging time of a pixel in the array substrate is not affected, either. In this way, a flicker uniformity and a quality of image display of the array substrate can be improved.

At least one embodiment of the present disclosure provides an array substrate, including: a base substrate, a pixel electrode located on the base substrate; a first gate line and a second gate line located on the base substrate at both sides of the pixel electrode, respectively, the pixel electrode being partially overlapped with the first gate line and the second gate line respectively to form a first storage capacitor and a second storage capacitor, respectively; a gate driver connected with the First gate line and the second gate line and configured to sequentially provide a gate signal to the first gate line and the second gate line and perform a waveform chamfering operation to the gate signal; a data line located on the base substrate; and a thin film transistor including a gate electrode connected with the first gate line, a source electrode connected with the pixel electrode, and a drain electrode connected with the data line, a parasitic capacitor being formed between the gate electrode and the source electrode.

For example, a sum of capacitance values of the first storage capacitor and the second storage capacitor is not less than 10 times of a capacitance value of the parasitic capacitor.

For example, at least one of the capacitance values of the first storage capacitor and the second storage capacitor is 2 to 8 times of the capacitance value of the parasitic capacitor.

For example, a chamfer slope of a chamfered waveform used in the waveform chamfering operation is in a range from 0.8 to 1.6.

For example, the chamfer slope of the chamfered waveform is 1.

For example, the first gate line includes a first protrusion overlapped with the pixel electrode, and the first storage capacitor is formed between the first protrusion and the pixel electrode; the second gate line includes a second protrusion overlapped with the pixel electrode, and the second storage capacitor is formed between the second protrusion and the pixel electrode.

For example, a material of at least one of the first protrusion and the second protrusion is a transparent conductive material.

For example, an overlap area of the first protrusion and the pixel electrode is a first overlap area; an overlap area of the second protrusion and the pixel electrode is a second overlap area; and a difference between the first overlap area and the second overlap area is not greater than three times of a smaller one of the first overlap area and the second overlap area.

For example, the first protrusion and the first gate line are formed in a same patterning process; and/or, the second protrusion and the second gate line are formed in a same patterning process.

For example, the gate driver includes an IC register configured to control the gate signal to be gradually decreased until a moment when the first gate line and the second gate line are not being selected.

At least one embodiment of the present disclosure provides a driving method of any of the above-mentioned array substrates, the driving method includes: inputting the gate signal to the first gate line to apply a turn-on voltage to the thin film transistor, and charging the pixel electrode through the turned-on thin film transistor by the data line so that a voltage of the pixel electrode is gradually increased to a value of a charging voltage; performing a waveform chamfering operation to the gate signal applied to the first gate line so that the voltage of the pixel electrode is gradually pulled down; inputting the gate signal to the second gate line so that the voltage of the pixel electrode is pulled up; performing a waveform chamfering operation to the gate signal applied to the second gate line so that the voltage of the pixel electrode is gradually pulled down and a value of the voltage of the pixel electrode reaching a steady state is equal to the value of the charging voltage.

For example, performing the waveform chamfering operation to the gate signal applied to the first gate line and the second gate line includes: controlling the gate signal applied to the first gate line and the second gate line to be gradually decreased by the gate driver so as to form a chamfered waveform in a voltage waveform of the gate signal applied to the first gate line and the second gate line, a chamfer slope of the chamfered waveform is in a range from 0.8 to 1.6.

At least one embodiment of the present disclosure provides a display device including any of the above-mentioned array substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
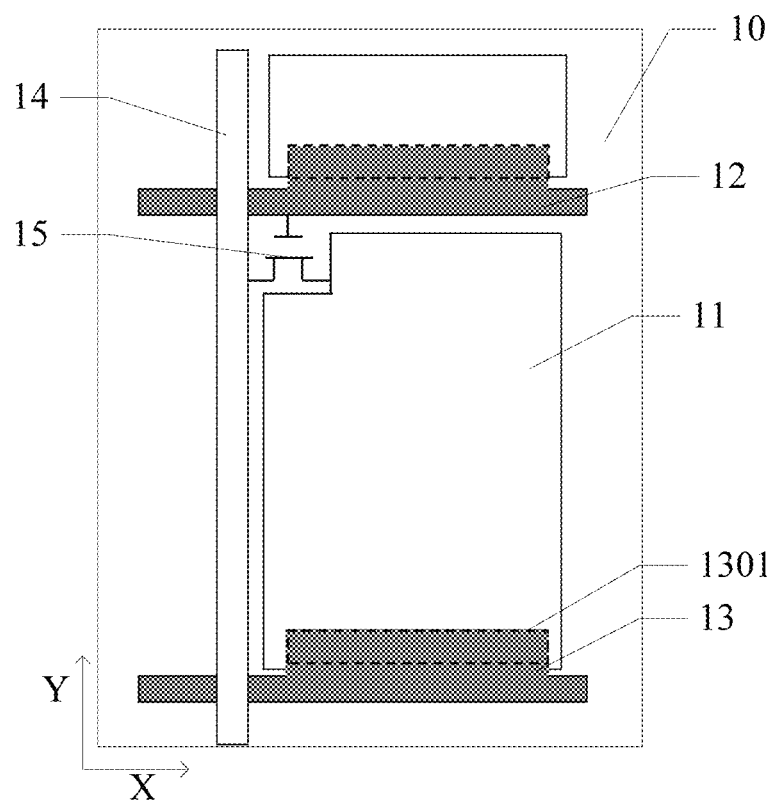
FIG. 1A is a plan view illustrating a part of an array substrate.
Figure 1B:
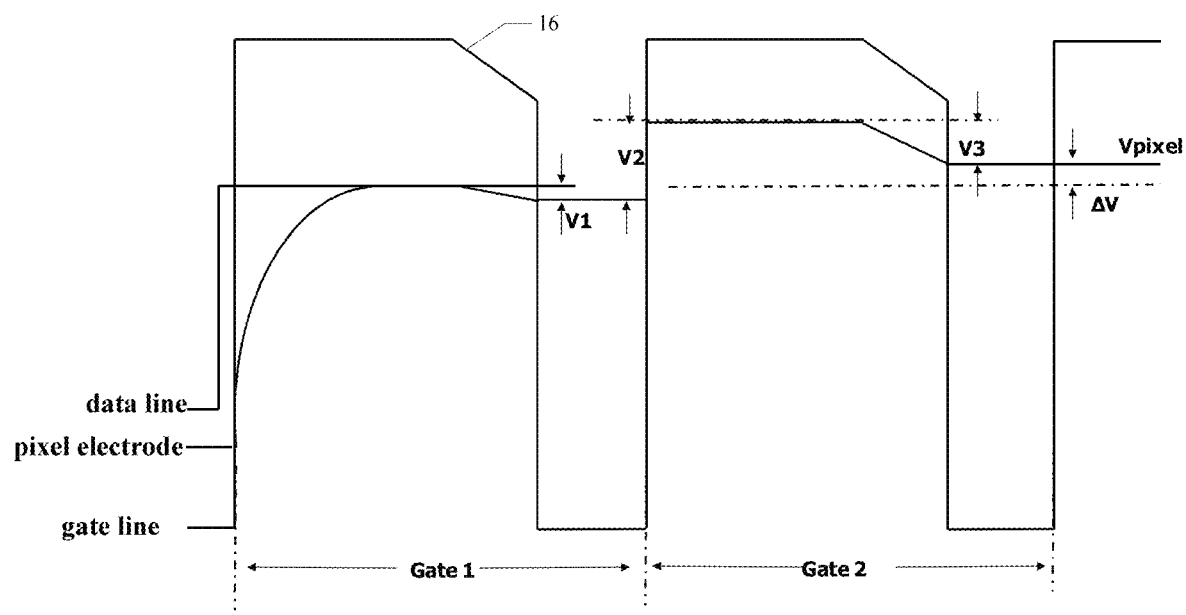
FIG. 1B is a schematic diagram illustrating a voltage waveform of the array substrate as illustrated in FIG. 1A.

FIG. 1A is a plan view illustrating a part of an array substrate, and FIG. 1B is a schematic diagram illustrating a voltage waveform of the array substrate as illustrated in FIG. 1A. As illustrated in FIG. 1A, in the case where the plan view of the part of the array substrate includes only one pixel unit by way of example, the array substrate includes a base substrate 10; a pixel electrode 11 located on the base substrate 10; two gate lines, i.e., a gate line 12 and a gate line 13, extending in an X direction and located on both sides of the pixel electrode 11, respectively; a data line 14 extending in a Y direction (only two gate lines and one data line are illustrated in FIG. 1A); and a thin film transistor 15. The gate line 12 is connected with a gate electrode of the thin film transistor 15 to control turning-on or turning-off of the thin film transistor 15. The pixel electrode 11 is connected with a source electrode of the thin film transistor 15. The data line 14 is connected with a drain electrode of the thin film transistor 15. A voltage signal required for image display is inputted to the pixel electrode 11 through the turned-on thin film transistor 15 to realize a display function of the array substrate.

As illustrated in FIGS. 1A and 1B, Gate1 indicates a voltage signal applied to the gate line 12, and Gate2 indicates a voltage signal applied to the gate line 13. The gate signal is sequentially inputted to the gate line 12 and the gate line 13 through a gate driver (not illustrated in the figure). When the gate driver applies a gate signal to the gate line 12 (that is, when the gate line 12 is being selected), the TFT 15 is controlled to be turned on by the gate line 12, a voltage signal is inputted to the pixel electrode 11 by the data line 14 through the turned-on TFT 15, and a voltage of the pixel electrode 11 gradually increases to a voltage value equal to a charging voltage supplied by the data line 14. At a predetermined moment, the gate driver performs a waveform chamfering operation to the gate signal applied to the gate line 12. For example, the gate signal applied to the gate line 12 can be controlled by an IC register in the gate driver to gradually reduce the gate signal. Therefore, the gate signal applied to the gate line 12 has a chamfered waveform 16 as illustrated in FIG. 1B. Under a combined action of the chamfered waveform 16 of the gate signal applied to the gate line 12 and the parasitic capacitor (with a capacitance value Cgs) between the gate electrode and the source electrode of the TFT 15, a voltage of the pixel electrode 11 decreases by V1 (that is, the voltage of the pixel electrode is pulled down by V1) after stopping inputting the gate signal to the gate line 12 (that is, when the gate line 12 is not being selected any more). When the gate driver applies a signal to the gate line 13, a storage capacitor (with a capacitance value Cs) is generated between the pixel electrode 11 and a portion 1301 of the gate line 13 overlapped with the pixel electrode 11. Therefore, as illustrated in FIG. 1B, when the gate line 13 is being selected, the pixel electrode 11 is equivalent to being charged, and the voltage of the pixel electrode 11 increases by V2 (that is, the voltage is pulled up by V2). Because both the gate line 12 and the gate line 13 are controlled by the gate driver, a voltage waveform of the gate signal applied to the gate line 13 is the same as that of the gate signal applied to the gate line 12. After stopping applying the gate signal to the gate line 13 (that is, when the gate line 13 is not being selected any more), the voltage of the pixel electrode 11 decreases by V3 (that is, the voltage of the pixel electrode is pulled down by V3). For example, a voltage value of the V1 can be about 0.1V and a voltage value of the V2 can be about 0.8V.

In the research, the inventor(s) of the present application found that a sustaining voltage of the pixel electrode 11, after a voltage of the pixel electrode 11 being pulled down twice and pulled up once, is not equal to a charging voltage; that is, $V2-(V1+V3)=\Delta V \neq 0$, a difference between the voltage maintained on the pixel electrode 11 and the charging voltage inputted by the data line 14 is $\Delta V$. If a chamfer slope of the chamfered waveform 16 of the voltage waveform of the gate line is adjusted so that the sustaining voltage of the pixel electrode 11 becomes equal to the charging voltage, then the chamfer slope of the chamfered waveform 16 is required to be very small due to the relatively smaller capacitance value Cgs of the parasitic capacitor, and a relatively smaller chamfer slope may affect a charging time of the pixel electrode 11.

The embodiments of the present disclosure provide an array substrate, a driving method thereof and a display device. The array substrate includes a base substrate; a pixel electrode located on the base substrate; a first gate line and a second gate line located on the base substrate at both sides of the pixel electrode respectively, the pixel electrode being partially overlapped with the first gate line and the second gate line respectively to form a first storage capacitor and a second storage capacitor respectively; a gate driver connected with the first gate line and the second gate line and configured to sequentially provide a gate signal to the first gate line and the second gate line and perform a waveform chamfering operation to the gate signal; a data line located on the base substrate; and a thin film transistor including a gate electrode connected with the first gate line, a source electrode connected with the pixel electrode, and a drain electrode connected with the data line, a parasitic capacitor being formed between the gate electrode and the source electrode. The pixel electrode in the array substrate and the gate lines on both sides of the pixel electrode, respectively, form storage capacitors. Under a combined action of the two storage capacitors and the waveform chamfering operation, the sustaining voltage of the pixel electrode is almost equal to the charging voltage, and the charging time of the pixel in the array substrate would not be affected, so that the flicker uniformity and the quality of the image display of the array substrate can be improved.

An array substrate, a driving method thereof and a display device provided in the embodiments of the present disclosure are described below with reference to the accompanying drawings.

Figure 2A:
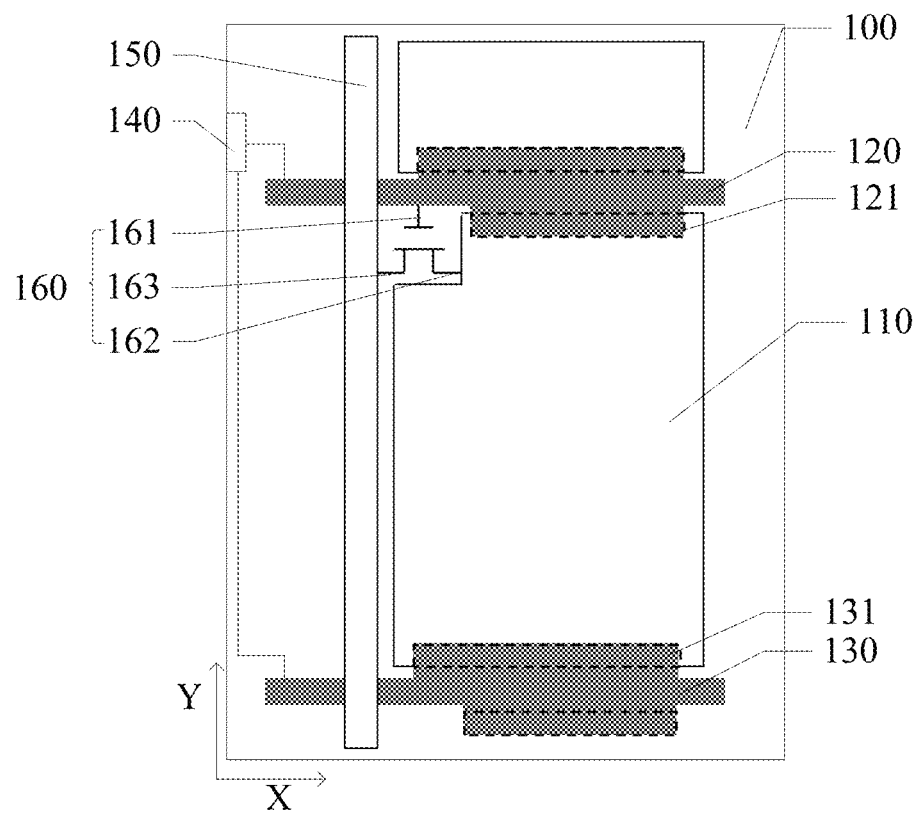
FIG. 2A is a plan view illustrating a part of an array substrate provided by an embodiment of the present disclosure.
Figure 2B:
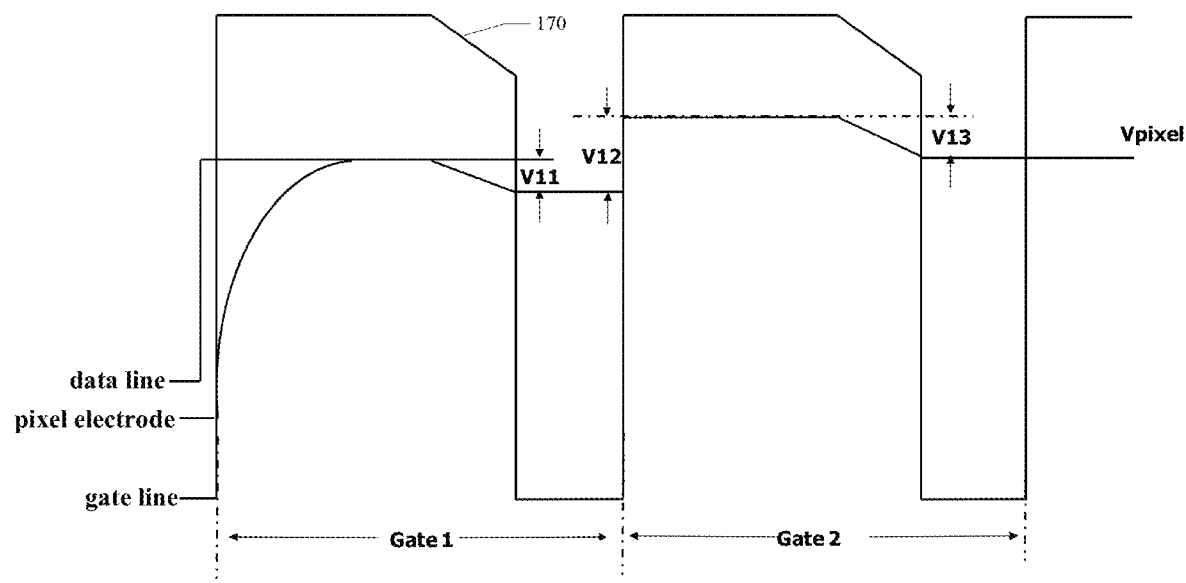
FIG. 2B is a schematic diagram illustrating a voltage waveform of the array substrate as illustrated in FIG. 2A.

An array substrate is provided by an embodiment of the present disclosure. FIG. 2A is a plan view illustrating a part of an array substrate according to an embodiment of the present disclosure; FIG. 2B is a schematic diagram illustrating a voltage waveform of the array substrate as illustrated in FIG. 2A. As illustrated in FIG. 2A, an embodiment of the present disclosure provides an array substrate, which includes a base substrate 100, a pixel electrode 110 disposed on the base substrate 100, a first gate line 120, a second gate line 130 and a gate driver 140. The first gate line 120 and the second gate line 130 are respectively located on two sides of the pixel electrode 110. The present embodiment is described with reference to the case where the first gate line 120 and the second gate line 130 extend in an X direction, by way of example. The pixel electrode 110 is partially overlapped with the first gate line 120 and the second gate line 130 respectively to form a first storage capacitor and a second storage capacitor respectively. The gate driver 140 is connected with the first gate line 120 and the second gate line 130, and is configured to sequentially provide a gate signal to the first gate line 120 and the second gate line 130 and perform a waveform chamfering operation to the gate signal. FIG. 2A schematically illustrates the gate driver 140, and connection lines between the gate driver 140 and each of the first gate line 120 and the second gate line 130 indicate that the gate driver 140 is electrically connected with the first gate line 120 and the second gate line 130 respectively. The pixel electrode in the array substrate provided by the present embodiment respectively forms storage capacitors with the first gate line and the second gate line which are located on both sides thereof. Under a combined action of the two storage capacitors and the waveform chamfering operation, a sustaining voltage of the pixel electrode is almost equal to the charging voltage, and the charging time of the pixel in the array substrate would not be affected. Therefore, the flicker uniformity and the quality of the image display of the array substrate are improved.

In this embodiment, any pixel electrode in the array substrate can be the pixel electrode 110 as illustrated in FIG. 2A. The gate lines on both sides of the pixel electrode 110 in the Y direction are respectively defined as the first gate line 120 and the second gate line 130, and the data line for supplying the voltage signal to the pixel electrode 110 can be the data line 150 as illustrated in FIG. 2A.

For example, description can be given with reference to the case where a direction parallel with the Y direction includes directions above and below the pixel electrode 110 by way of example. In such case, for a pixel electrode above the pixel electrode 110, the first gate line 120 herein is a second gate line of the pixel electrode above the pixel electrode 110; for a pixel electrode below the pixel electrode 110, the second gate line 130 herein is a first gate line of the pixel electrode below the pixel electrode 110. Therefore, a second storage capacitor is formed between the pixel electrode above the pixel electrode 110 and the first gate line 120, a first storage capacitor is formed between the pixel electrode below the pixel electrode 110 and the second gate line 130. That is, for a single gate line, it can respectively forms a first storage capacitor and a second storage capacitor with the two pixel electrodes distributed on upper and lower sides of the gate line, respectively.

For example, in the embodiment, each pixel electrode has an overlap area with the gate line arranged on each side of the pixel electrode. That is, each gate line has an overlap area with the pixel electrode on each side of the gate line.

As illustrated in FIG. 2A, the array substrate provided in this embodiment further includes a data line 150 and a thin film transistor 160 located on the base substrate 100. The first gate line 120 is connected with the gate electrode 161 of the thin film transistor 160 to control turning-on and turning-off of the thin film transistor 160. The pixel electrode 110 is connected with the source electrode 162 of the thin film transistor 160. The data line 150 is connected with the drain electrode 163 of the thin film transistor 160. Therefore, a voltage signal as required is inputted to the pixel electrode 110 through the thin film transistor 160 to realize the display function of the array substrate. A parasitic capacitor is formed between the gate electrode 161 and the source electrode 162 of the thin film transistor 160.

For example, a sum of a capacitance value Cs1 of the first storage capacitor and a capacitance value Cs2 of the second storage capacitor is not less than 10 times of the capacitance value Cgs of the parasitic capacitor; that is, $10\ Cgs \leq Cs1+Cs2$. Assuming that the capacitance value formed between the gate line 13 and the pixel electrode 11 in a conventional structure design of storage capacitor as illustrated in FIG. 1A is Cs, the sum of the capacitance value Cs1 of the first storage capacitor and the capacitance value Cs2 of the second storage capacitor is equal to the capacitance values Cs. That is, the sum of the capacitance values of the storage capacitors formed by the first gate lines 120 (the second gate lines 130) provided in this embodiment and the two pixel electrodes on both sides thereof respectively is equal to a capacitance value of the storage capacitor in a conventional structural design.

For example, the capacitance value Cs1 of the first storage capacitor is 2-8 times of the capacitance value Cgs of the parasitic capacitor, which is included but not limited in the embodiment.

For example, the capacitance value Cs2 of the second storage capacitor is 2-8 times of the capacitance value Cgs of the parasitic capacitor, which is included but not limited in the embodiment.

For example, as illustrated in FIG. 2A, the first gate line 120 includes a first protrusion 121 overlapped with the pixel electrode 110, and a first storage capacitor is formed between the first protrusion 121 and the pixel electrode 110. The second gate line 130 includes a second protrusion 131 overlapped with the pixel electrode 110, and a second storage capacitor is formed between the second protrusion 131 and the pixel electrode 110. Therefore, the overlap portion of the first gate line (the second gate line) and the pixel electrode in this embodiment is generated by the first gate line (second gate line) extending to the pixel electrodes on both sides thereof in the Y direction for forming a protrusion. Considering a portion of the first gate line (second gate line) that does not have the first protrusion (the second protrusion) has a narrower width in the Y direction, the design with such overlap provided by the present embodiment is easy to implement. The embodiment is not limited thereto. For example, the pixel electrode can also be extended to the gate lines on both sides thereof so as to be overlapped with the gate lines.

For example, as illustrated in FIG. 2A, the first protrusion 121 included in the first gate line 120 can be formed in the same patterning process with the first gate line 120. For example, the second protrusion 131 included in the second gate line 130 can also be formed in the same patterning process with the second gate line 130. Therefore, in one example of this embodiment, a material of the first protrusion is the same as that of the first gate line, and a material of the second protrusion is the same as that of the second gate line, which is included but not limited in the embodiment.

For example, in an example of the embodiment, a material of at least one of the first protrusion and the second protrusion is a transparent conductive material, that is, at least one of the first protrusion and the second protrusion can be made separately from the first gate line or the second gate line.

For example, the transparent conductive material used for at least one of the first protrusion and the second protrusion can include a transparent conductive material such as indium tin oxide, which is included in the present example but is not limitative. In the case where at least one of the first protrusion and the second protrusion provided in this example is a transparent conductive material, the influence on the aperture ratio of the pixel unit can be minimized as far as possible.

For example, as illustrated in FIG. 2A, an overlap area of the first protrusion 121 and the pixel electrode 110 is a first overlap area S1, an overlap area of the second protrusion 131 and the pixel electrode 110 is a second overlap area S2, and a difference between the first overlap area S1 and the second overlap area S2 is not greater than three times of a smaller one of the first overlap area S1 and the second overlap area S2, so that at least one of the capacitance values of the first storage capacitor and the second storage capacitor is 2-8 times of a capacitance value of the parasitic capacitor. That is, in this embodiment, the capacitance value Cs1 of the first storage capacitor and the capacitance value Cs2 of the second storage capacitor are adjusted by adjusting the first overlap area S1 and the second overlap area S2.

For example, description will be given with reference to the case where the sum of the first overlap area S1 and the second overlap area S2 is 10 units by way of example. For example, the first overlap area S1 can be 4 units and the second overlap area S2 can be 6 units. For example, the first overlap area S1 can be 5 units and the second overlap area S2 can be 5 units. For example, the first overlap area S1 can be 7 units and the second overlap area S2 can be 3 units. For example, the first overlap area S1 can be 2 units and the second overlap area S2 can be 8 units; and so on. The embodiment includes, but not limited thereto, as long as the difference between the first overlap area S1 and the second overlap area S2 is not greater than three times of a smaller one of the first overlap area S1 and the second overlap area S2.

For example, as illustrated in FIG. 2B, the voltage waveform of the gate signal applied to the first gate line 120 and the second gate line 130 includes a chamfered waveform, the chamfered waveform can be obtained by using an IC register to control the gate signal applied to the first gate line 120 and the second gate line 130 to be gradually decreased until a moment when the first gate line 120 or the second gate line 130 is not being selected anymore. At this time, a chamfered waveform 170 is formed in the voltage waveform of the first gate line 120 and the second gate line 130. The IC register provided in this embodiment can be a part of the gate driver 140 but is not limited thereto, and can also be a different component from the gate driver.

For example, as illustrated in FIGS. 2A and 2B, Gate1 indicates a signal applied to the first gate line 120, and Gate2 indicates a signal applied to the second gate line 130. When the gate signal is applied to the first gate line 120 by the gate driver 140 (i.e., when the first gate line 120 is being selected), the TFT 160 is controlled to be turned on. The data line 150 inputs a voltage signal to the pixel electrode 110 through the turned-on TFT 160. The voltage of the pixel electrode 110 gradually increases to a voltage value equal to a charging voltage provided by the data line 150. At a certain moment, the waveform chamfering operation is performed to the gate signal applied to the first gate line 120, so that the gate signal applied to the first gate line 120 has a chamfered waveform 170 as illustrated in FIG. 2B. Under a combined action of the chamfered waveform 170 of the gate signal applied to the first gate line 120, the parasitic capacitor (with a capacitance value Cgs) of the TFT 160 and the first storage capacitor (with a capacitance value Cs1) generated between the first gate line 120 and the pixel electrode 110, the voltage of the pixel electrode 110 drops by V11 (that is, the voltage of the pixel electrode is pulled down by V11) after stopping applying the gate signal to the first gate line 120 (that is, when the first gate line 120 is not being selected any more). The gate driver 140 starts to apply a signal to the second gate line 130, and the second protrusion 131 of the second gate line 130 generates a second storage capacitor (with a capacitance value Cs2) with the pixel electrode 110. Therefore, as illustrated in FIG. 2B, when the second gate line 130 is being selected, the pixel electrode 110 is equivalent to being charged, and the voltage increases by V12 (that is, the voltage is pulled up by V12). In this embodiment, both the first gate line 120 and the second gate line 130 are controlled by the gate driver 140. Therefore, a voltage waveform of the gate signal applied to the second gate line 130 is the same as that of the gate signal applied to the first gate line 120. After stopping applying the gate signal to the second gate line 130 (that is, when the second gate line 130 is not being selected any more), the voltage of the pixel electrode 110 decreases by V13 (that is, the voltage of the pixel electrode is pulled down by V13).

For example, as illustrated in FIG. 2B, a chamfer slope of the chamfered waveform 170 in the voltage waveform of the first gate line 120 and the second gate line 130 provided in this embodiment is in a range from about 0.8 to about 1.6, which is included in the present embodiment but is not limitative.

For example, as illustrated in FIG. 2B, the chamfer slope of the chamfer waveform 170 is about 1, that is, a chamfer angle of the chamfered waveform 170 is about 45°.

As can be seen from the voltage waveform illustrated in FIG. 2B, after the voltage of the pixel electrode 110 being pulled down twice and pulled up once, a sustaining voltage of the pixel electrode 110 is equal to a charging voltage, that is, V12=V11+V13, and a value of the sustaining voltage of the pixel electrode 110 is equal to a value of the charging voltage inputted by the data line 150. Therefore, the array substrate provided by the present embodiment can enable the sustaining voltage of the pixel electrode to be equal to the charging voltage to the maximum extent by adjusting the first storage capacitor, the second storage capacitor, and the chamfer slop of the chamfered waveform, so as to improve the flicker uniformity and the quality of image display of the array substrate. On the other hand, the selection of the chamfer slope of the chamfered waveform in the voltage waveform in this embodiment would not affect the charging time of the pixel.

As illustrated in FIG. 2B, for the waveform chamfering operation in the embodiments of the present disclosure, for example, the voltage value can be gradually decreased near a high-level falling edge of a rectangular waveform signal so as to form a chamfer at the high-level falling edge of the rectangular waveform. In this way, a chamfered waveform is formed. For example, a slope of a slope line of the voltage value changing with time as the voltage gradually decreases is the chamfer slope. The slope can be calculated based on a coordinate system of which a time axis is an X-axis and a voltage value is a Y-axis.

In addition, the first gate line and the second gate line are described with respect to the same pixel electrode. The first gate line is a gate line connected with the pixel electrode through a thin film transistor, and the second gate line is another gate line. For example, the second gate line can be connected with another pixel electrode through another thin film transistor. For example, the first gate line and the second gate line can be gate lines corresponding to adjacent pixel rows, without particularly limited in the embodiment of the present disclosure.

Figure 3:
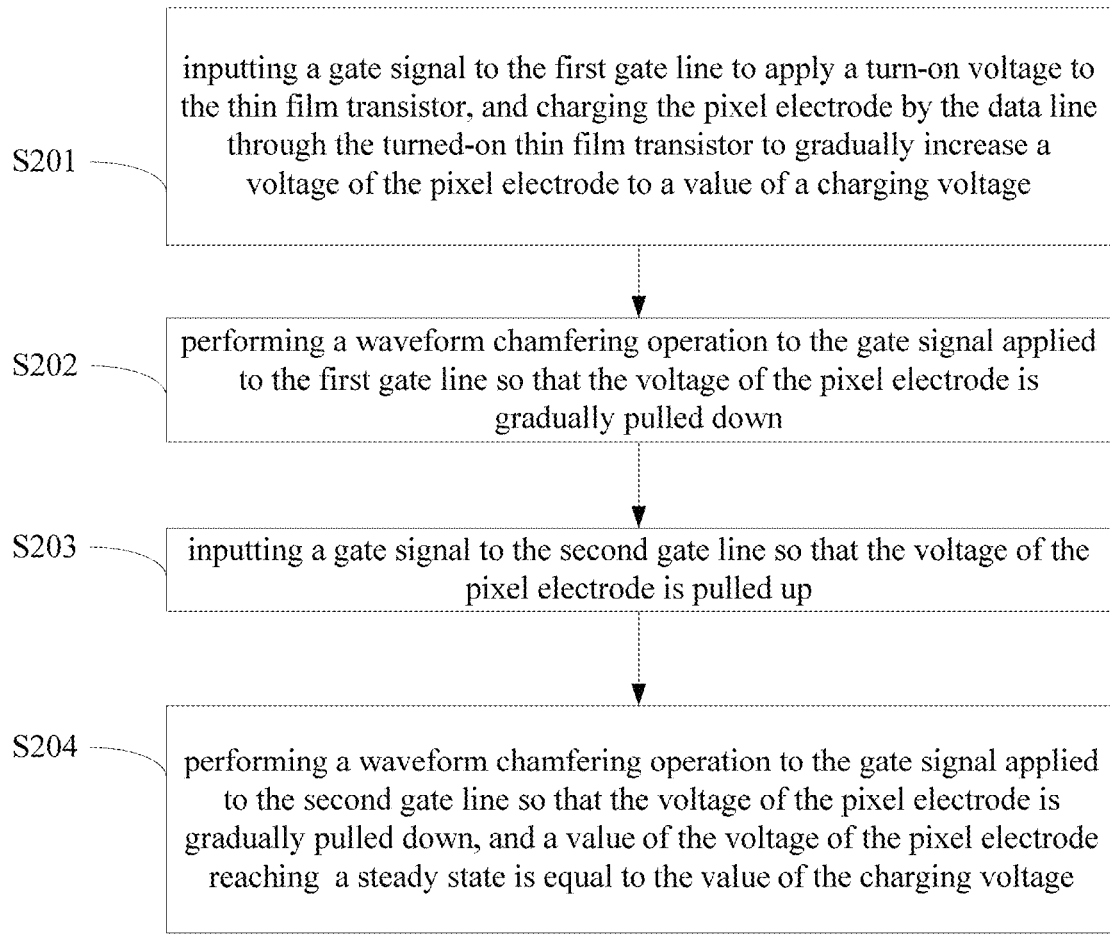
FIG. 3 is a flowchart illustrating a driving method of an array substrate provided by an embodiment of the present disclosure.

Another embodiment of the present disclosure provides a driving method of an array substrate. The array substrate can be any one of the array substrates provided in the previous embodiments. FIG. 3 is a flowchart illustrating a driving method of an array substrate according to an embodiment of the present disclosure. As illustrated in FIG. 3, the driving method includes:

S201: inputting a gate signal to the first gate line to apply a turn-on voltage to the thin film transistor, and charging the pixel electrode by the data line through the turned-on thin film transistor to gradually increase a voltage of the pixel electrode to a value of a charging voltage.

For example, the array substrate includes a pixel electrode, a first gate line, a second gate line, and a gate driver. The array substrate further includes a data line and a thin film transistor. The thin film transistor includes a gate electrode connected with the first gate line, a source electrode connected with the pixel electrode, and a drain electrode connected with the data line. The parasitic capacitance is formed between the gate electrode and the source electrode of the thin film transistor.

For example, the pixel electrode is partially overlapped with the first gate line and the second gate line, respectively, to form a first storage capacitor and a second storage capacitor, respectively. The gate driver is connected with the first gate line and the second gate line, and is configured to sequentially provide the gate signal to the first gate line and the second gate line and perform a waveform chamfering operation to the gate signal.

For example, the gate driver is configured to input a gate signal to the first gate line and apply a turn-on voltage to the thin film transistor through the first gate line, so as to control the thin film transistor to be turned on. The data line is configured to charge the pixel electrode through the turned-on thin film transistor so that the voltage of the pixel electrode is gradually increased to a value of the charging voltage.

S202: performing a waveform chamfering operation to the gate signal applied to the first gate line so that the voltage of the pixel electrode is gradually pulled down.

For example, at a certain moment when the gate driver is inputting the gate signal to the first gate line, an IC register can be used to control the gate signal of the first gate line to be gradually decreased. Therefore, a chamfered waveform is formed in the voltage waveform of the first gate line. Under a combined action of the chamfered waveform of the gate signal applied to the first gate line, the parasitic capacitor of the thin film transistor, and the first storage capacitor generated between the first gate line and the pixel electrode, the voltage of the pixel electrode is gradually pulled down.

S203: inputting a gate signal to the second gate line so that the voltage of the pixel electrode is pulled up.

For example, the gate driver starts to apply a signal to the second gate line. Because the second storage capacitor is generated between the pixel electrode and the overlap portion of the second gate line with the pixel electrode, when the second gate line is being selected, the pixel electrode is equivalent to being charged and the voltage of the pixel electrode increases (i.e., the voltage of the pixel electrode is pulled up).

S204: performing a waveform chamfering operation to the gate signal applied to the second gate line so that the voltage of the pixel electrode is gradually pulled down, and a value of the voltage of the pixel electrode reaching a steady state is equal to the value of the charging voltage.

For example, performing the waveform chamfering operation to the gate signal applied to the first gate line and the second gate line includes: controlling the gate signal applied to the first gate line and the second gate line to be gradually decreased by a gate driver (for example, an IC register), to form a chamfered waveform in the voltage waveform of the first gate line and the second gate line, in which a chamfer slope of the chamfered waveform is in a range from 0.8 to 1.6.

For example, as illustrated in FIG. 2B, after the voltage of the pixel electrode being pulled down twice and pulled up once, the sustaining voltage of the pixel electrode is equal to the charging voltage, that is, the sustaining voltage of the pixel electrode is equal to the charging voltage inputted by the data line. Therefore, the driving method of the array substrate provided by the present embodiment can enable the sustaining voltage of the pixel electrode to be equal to the charging voltage to a maximum extent by adjusting the chamfer slope of the chamfered waveform while maintaining the first storage capacitor and the second storage capacitor being constant, thereby improving the flicker uniformity and the quality of the image display of the array substrate.

For example, the chamfer slope of the chamfered waveform is about 1, that is, the chamfer angle is about 45°.

Therefore, the selection of the chamfer slope of the chamfered waveform in the driving method provided in this embodiment would not affect the charging time of the pixel.

Yet another embodiment of the present disclosure provides a display device including any one of the array substrates provided by the previous embodiments. With such display device, the sustaining voltage of the pixel electrode can be equal to the charging voltage to a maximum extent so as to improve the flicker uniformity and the quality of the image display of the array substrate. On the other hand, the selection of the chamfer slope of the chamfered waveform in the voltage waveform in this embodiment would not affect the charging time of the pixel.

For example, the display device can be any product or component having a display function such as liquid crystal display device, organic light-emitting diode (OLED) display device, television, digital camera, cell phone, watch, tablet computer, laptop, and navigation device, but the embodiment of the present disclosure is not limited thereto.

The following statements should be noted:

(1) The same reference numerals denote the same elements/components unless otherwise defined.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure can be enlarged. However, it should understood that, in the case in which a component or element such as a layer, film, area, substrate or the like is referred to be "on" or "under" another component or element, it can be directly on or under the another component or element or a component or element is interposed therebetween.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The application claims priority to the Chinese patent application No. 201710772814.0, filed on Aug. 31, 2017, entitled "array substrate and driving method thereof, display device", the entire disclosure of which is incorporated herein by reference as part of the present application.

The invention claimed is:

1. An array substrate, comprising:
a base substrate,
a pixel electrode, located on the base substrate;
a first gate line and a second gate line, located on the base substrate at both sides of the pixel electrode, respectively, the pixel electrode being partially overlapped with the first gate line and the second gate line, respectively, to form a first storage capacitor and a second storage capacitor, respectively;
a gate driver, connected with the first gate line and the second gate line, respectively, and configured to sequentially provide a gate signal to the first gate line and the second gate line and perform a waveform chamfering operation to the gate signal;
a data line, located on the base substrate; and
a thin film transistor, comprising a gate electrode connected with the first gate line, a source electrode connected with the pixel electrode, and a drain electrode connected with the data line, a parasitic capacitor being formed between the gate electrode and the source electrode, wherein
a sum of capacitance values of the first storage capacitor and the second storage capacitor is not less than 10 times of a capacitance value of the parasitic capacitor, and
at least one of the capacitance values of the first storage capacitor and the second storage capacitor is 2 to 8 times of the capacitance value of the parasitic capacitor.

2. The array substrate according to claim 1, wherein a chamfer slope of a chamfered waveform used in the waveform chamfering operation is in a range from 0.8 to 1.6.

3. The array substrate according to claim 1, wherein a chamfer slope of a chamfered waveform used in the waveform chamfering operation is in a range from 0.8 to 1.6.

4. The array substrate according to claim 1, wherein a chamfer slope of a chamfered waveform used in the waveform chamfering operation is in a range from 0.8 to 1.6.

5. The array substrate according to claim 2, wherein the chamfer slope of the chamfered waveform is 1.

6. The array substrate according to claim 1, wherein the first gate line comprises a first protrusion overlapped with the pixel electrode, and the first storage capacitor is formed between the first protrusion and the pixel electrode; the second gate line comprises a second protrusion overlapped with the pixel electrode, and the second storage capacitor is formed between the second protrusion and the pixel electrode.

7. The array substrate according to claim 6, wherein a material of at least one of the first protrusion and the second protrusion is a transparent conductive material.

8. The array substrate according to claim 6, wherein an overlap area of the first protrusion and the pixel electrode is a first overlap area, an overlap area of the second protrusion and the pixel electrode is a second overlap area, and
a difference between the first overlap area and the second overlap area is not greater than three times of a smaller one of the first overlap area and the second overlap area.

9. The array substrate according to claim 6, wherein,
the first protrusion and the first gate line are formed in a same patterning process;
and/or,
the second protrusion and the second gate line are formed in a same patterning process.

10. The array substrate according to claim 1, wherein,
the gate driver comprises an IC register configured to control the gate signal to be gradually decreased until a moment when the first gate line and the second gate line are not being selected.

11. A driving method of the array substrate according to claim 1, comprising:
inputting the gate signal to the first gate line to apply a turn-on voltage to the thin film transistor, and charging the pixel electrode through the turned-on thin film transistor by the data line so that a voltage of the pixel electrode is gradually increased to a value of a charging voltage;
performing a waveform chamfering operation to the gate signal applied to the first gate line so that the voltage of the pixel electrode is gradually pulled down;
inputting the gate signal to the second gate line so that the voltage of the pixel electrode is pulled up; and
performing a waveform chamfering operation to the gate signal applied to the second gate line so that the voltage of the pixel electrode is gradually pulled down, and a value of the voltage of the pixel electrode reaching a steady state is equal to the value of the charging voltage.

12. The driving method according to claim 11, wherein performing the waveform chamfering operation to the gate signal applied to the first gate line and the second gate line comprises:
controlling the gate signal applied to the first gate line and the second gate line to be gradually decreased by the gate driver so as to form a chamfered waveform in a voltage waveform of the gate signal applied to the first gate line and the second gate line,
wherein a chamfer slope of the chamfered waveform is in a range from 0.8 to 1.6.

13. A display device, comprising the array substrate according to claim 1.

14. The display device according to claim 13, wherein a chamfer slope of a chamfered waveform used in the waveform chamfering operation is in a range from 0.8 to 1.6.

15. The display device according to claim 13, wherein the first gate line comprises a first protrusion overlapped with the pixel electrode, and the first storage capacitor is formed between the first protrusion and the pixel electrode; the second gate line comprises a second protrusion overlapped with the pixel electrode, and the second storage capacitor is formed between the second protrusion and the pixel electrode.

16. The display device according to claim 15, wherein an overlap area of the first protrusion and the pixel electrode is a first overlap area, an overlap area of the second protrusion and the pixel electrode is a second overlap area, and
 a difference between the first overlap area and the second overlap area is not greater than three times of a smaller one of the first overlap area and the second overlap area.

17. An array substrate, comprising:
a base substrate,
a pixel electrode, located on the base substrate;
a first gate line and a second gate line, located on the base substrate at both sides of the pixel electrode, respectively, the pixel electrode being partially overlapped with the first gate line and the second gate line, respectively, to form a first storage capacitor and a second storage capacitor, respectively;
a gate driver, connected with the first gate line and the second gate line, respectively, and configured to sequentially provide a gate signal to the first gate line and the second gate line and perform a waveform chamfering operation to the gate signal;
a data line, located on the base substrate; and
a thin film transistor, comprising a gate electrode connected with the first gate line, a source electrode connected with the pixel electrode, and a drain electrode connected with the data line, a parasitic capacitor being formed between the gate electrode and the source electrode, wherein
the first gate line comprises a first protrusion overlapped with the pixel electrode, and the first storage capacitor is formed between the first protrusion and the pixel electrode; the second gate line comprises a second protrusion overlapped with the pixel electrode, and the second storage capacitor is formed between the second protrusion and the pixel electrode,
an overlap area of the first protrusion and the pixel electrode is a first overlap area, an overlap area of the second protrusion and the pixel electrode is a second overlap area, and
a difference between the first overlap area and the second overlap area is not greater than three times of a smaller one of the first overlap area and the second overlap area.

* * * * *